United States Patent
Mukherjee et al.

(10) Patent No.: US 6,787,198 B2
(45) Date of Patent: Sep. 7, 2004

(54) HYDROTHERMAL TREATMENT OF NANOSTRUCTURED FILMS

(75) Inventors: Shyama P. Mukherjee, Morgan Hill, CA (US); Harold O. Madsen, Rio Rancho, NM (US); Paul J. Roman, Jr., San Ramon, CA (US); Leo G. Svendsen, San Francisco, CA (US)

(73) Assignee: EKC Technology, Inc., Hayward, CA (US)

( * ) Notice: Subject to any disclaimer, the term of this patent is extended or adjusted under 35 U.S.C. 154(b) by 79 days.

(21) Appl. No.: 10/280,270

(22) Filed: Oct. 23, 2002

(65) Prior Publication Data

US 2003/0157250 A1 Aug. 21, 2003

Related U.S. Application Data

(63) Continuation-in-part of application No. 10/261,197, filed on Sep. 30, 2002, now Pat. No. 6,723,388, which is a continuation-in-part of application No. 09/918,908, filed on Jul. 30, 2001, now Pat. No. 6,458,431.
(60) Provisional application No. 60/221,844, filed on Jul. 28, 2000.

(51) Int. Cl.$^7$ ............................................. C23C 14/04
(52) U.S. Cl. .................... 427/526; 427/377; 427/383.1; 427/523; 427/529; 427/530; 427/531; 427/533; 427/551; 427/552; 427/553; 427/555; 427/556; 427/596
(58) Field of Search ................................ 427/523, 526, 427/529, 530, 531, 533, 551, 552, 553, 555, 556, 377, 383.1, 596

(56) References Cited

U.S. PATENT DOCUMENTS

| | | | |
|---|---|---|---|
| 5,534,312 A | 7/1996 | Hill et al. | 427/533 |
| 5,851,507 A | 12/1998 | Pirzada et al. | 423/659 |
| 5,952,040 A | 9/1999 | Yadav et al. | 427/126.3 |
| 5,984,997 A | 11/1999 | Bickmore et al. | 75/343 |
| 6,380,105 B1 | 4/2002 | Smith et al. | 438/778 |
| 2002/0076495 A1 | 6/2002 | Maloney et al. | 427/272 |

OTHER PUBLICATIONS

G. Counio, et al., "$Cd_{1-x} Mn_xS$ Nanoparticles (x $\leq$5%) in Sol–Gel Matrices," Electrochem. Soc. Proceedings, vol. 97–11, pp. 35–46 (1997), no month avail.

Y. Yonezawa, et al., "Formation of silver metal films by photolysis of silver salts of high molecular weight carboxylic acids," Thin Solid Films, 218 (1992) 109–121, no month avail.

International Search Report for International Application No. PCT/CA01/01094, International filing date Jul. 3, 2001.

J. Bravo–Vasquez, et al., "The Photolithographic Deposition of Nanostructured Materials," Polymeric Materials Science and Engineering, vol. 81, (1999) pp. 16–17, no month avail.

*Primary Examiner*—Bernard Pianalto
(74) *Attorney, Agent, or Firm*—Morgan, Lewis & Bockius

(57) ABSTRACT

The present invention involves the hydrothermal treatment of nanostructured films to form high k PMOD™ films for use in applications that are temperature sensitive, such as applications using a polymer based substrate. After a PMOD™ precursor is deposited and converted on a substrate, and possibly after other process steps, the amorphous, nanoporous directly patterned film is subjected to low temperature hydrothermal treatment to densify and possibly crystallize the resulting high dielectric PMOD™ film. A post hydrothermal treatment bake is then performed to remove adsorbed water.

21 Claims, 1 Drawing Sheet

HYDROTHERMAL TREATMENT OF NANOSTRUCTURED FILMS

CROSS-REFERENCE TO RELATED APPLICATIONS

The present application is a continuation-in-part of U.S. application Ser. No. 10/261,197, entitled "Nanostructured and Nanoporous Film Compositions, Structures, and Methods for Making the Same," filed Sep. 30, 2002, now U.S. Pat. No. 6,723,388 which is a continuation-in-part of U.S. application Ser. No. 09/918,908, filed Jul. 30, 2001, now U.S. Pat. No. 6,458,431, which claims priority to Provisional Patent Application No. 60/221,844, filed Jul. 28, 2000, each of which is hereby incorporated herein by reference in its entirety.

FIELD OF THE INVENTION

The field of the present invention involves the hydrothermal treatment of photolytically deposited metal and metal oxide films to favorably alter film characteristics at low temperatures for use in semiconductor manufacturing.

BACKGROUND OF THE INVENTION

The semiconductor and packaging industries, among others, utilize conventional processes to form thin metal and metal oxide films in their products. Examples of such processes include evaporation, sputter deposition or sputtering, chemical vapor deposition ("CVD") and thermal oxidation. Evaporation is a process whereby a material to be deposited is heated near the substrate on which deposition is desired. Normally conducted under vacuum conditions, the material to be deposited volatilizes and subsequently condenses on the substrate, resulting in a blanket, or unpatterned, film of the desired material on the substrate. This method has several disadvantages, including the requirement to heat the desired film material to high temperatures and the need for high vacuum conditions.

Sputtering is a technique similar to evaporation, in which the process of transferring the material for deposition into the vapor phase is assisted by bombarding that material with incident atoms of sufficient kinetic energy such that particles of the material are dislodged into the vapor phase and subsequently condense onto the substrate. Sputtering suffers from the same disadvantages as evaporation and, additionally, requires equipment and consumables capable of generating incident particles of sufficient kinetic energy to dislodge particles of the deposition material.

CVD is similar to evaporation and sputtering but further requires that the particles being deposited onto the substrate and undergo a chemical reaction during the deposition process in order to form a film on the substrate. While the requirement for a chemical reaction distinguishes CVD from evaporation and sputtering, the CVD method still demands the use of sophisticated equipment and extreme conditions of temperature and pressure during film deposition.

Thermal oxidation also employs extreme conditions of temperature and an oxygen atmosphere. In this technique, a blanket layer of an oxidized film on a substrate is produced by oxidizing an unoxidized layer which had previously been deposited on the substrate.

Several existing film deposition methods may be undertaken under conditions of ambient temperature and pressure, including sol-gel and other spin-on methods. In these methods, a solution containing a precursor compound that may be subsequently converted to the desired film composition is applied to the substrate. The application of this solution may be accomplished through spin-coating or spin-casting, where the substrate is rotated around an axis while the solution is dropped onto the middle of the substrate. After such application, the coated substrate is subjected to high temperatures which convert the film into a film of the desired material. Thus, these methods do not allow for direct imaging to form patterns of the amorphous film. Instead, they result in blanket, unpatterned films of the desired material. These methods have less stringent equipment requirements than the vapor-phase methods, but still require the application of extreme temperatures to effect conversion of the deposited film to the desired material.

In one method of patterning blanket films, the blanket film is coated (conventionally by spin coating or other solution-based coating methods; or by application of a photosensitive dry film) with a photosensitive coating. This photosensitive layer is selectively exposed to light of a specific wavelength through a mask. The exposure changes the solubility of the exposed areas of the photosensitive layer in such a manner that either the exposed or unexposed areas may be selectively removed by use of a developing solution. The remaining material is then used as a pattern transfer medium, or mask, to an etching medium that patterns the film of the desired material. Following this etch step, the remaining (formerly photosensitive) material is removed, and any by-products generated during the etching process are cleaned away if necessary.

In another method of forming patterned films on a substrate, a photosensitive material may be patterned as described above. Following patterning, a conformal blanket of the desired material may be deposited on top of the patterned (formerly photosensitive) material, and then the substrate with the patterned material and the blanket film of the desired material may be exposed to a treatment that attacks the formerly photosensitive material. This treatment removes the remaining formerly photosensitive material and with it portions of the blanket film of desired material on top. In this fashion a patterned film of the desired material results; no etching step is necessary in this "liftoff" process. However, the use of an intermediate pattern transfer medium (photosensitive material) is still required, and this is a disadvantage of this method. It is also known that the "liftoff" method has severe limitations with regard to the resolution (minimum size) that may be determined by the pattern of the desired material. This disadvantage severely limits the usefulness of this method.

It is thus evident that the conventional processes for the deposition of blanket films that subsequently need to be patterned invokes the need for several extra costly and difficult processing steps. However, some semiconductor applications, such as applications using a polymer-based substrate, are sensitive to the high temperatures typical in such conventional processes. Therefore a need exists for a low temperature deposition and patterning means of forming films in such applications.

While some of these methods are more equipment-intensive than others and differ in the use of either solution- or vapor-phase methods, such conventional processes for forming metal and metal oxide films is not optimal because, for example, they each require costly equipment, are time consuming, require the use of high temperatures to achieve the desired result, and result in blanket, unpatterned films where, if patterning is needed, further patterning steps are required. A desirable alternative to these methods would be the use of a precursor material that may be applied to a substrate and selectively imaged and directly photolytically patterned to form an amorphous film without the need for intermediate steps. Such films are herein referred to as a film deposited by photochemical metal organic deposition (PMOD™ film), as described in U.S. Pat. No. 5,534,312, which is incorporated herein by reference in its entirety.

Such films may have a certain amount of porosity due to the existence of nanopores in the film matrix. The level of porosity is a factor of the process conditions used, as described in co-pending application entitled "Nanostructured and Nanoporous Film Compositions, Structures, and Methods for Making the Same," filed Sep. 30, 2002 and incorporated herein by reference in its entirety. As the porosity of such films increases, the density and permitivity decrease. In applications that require a high dielectric constant (k), including embedded capacitors for electronic packaging, future gate oxides for transistors in semiconductor devices, high-density dynamic random access memory (DRAM), piezoelectric micro-or nanoactuators, sensors and microwave tuning devices, this is not preferable. Additionally, in some applications it may be preferable to use crystalline, not amorphous films, such as when ferroelectric behavior is desired (e.g., use as a decoupling capacitor).

Conventional annealing methods that may be used to crystallize such films, also decrease the porosity of such films causing outgassing of the nanopores. However, the current and future industry needs have led to the use of polymer based electronic packaging substrates. Polymer based substrates cannot undergo conventional high temperature (>400° C.) heat treatment needed to increase the density and dielectric constant of deposited films containing nanopores. The use of polymer based electronic packaging substrate will likely continue to increase due to cost and property reasons (e.g., flexibility, processing ease, variety of available polymers, substrate cost, availability in large areas).

Accordingly, there is a need for a method for the densification and/or the crystallization, into a nanocrystalline state, of PMOD™ films in semiconductor applications sensitive to high temperature conventional processing methods, such as where polymer based electronic packaging substrates are used. In addition, there is a need for a directly photopatterned high dielectric constant (k) metal oxide thin films that combines the ease of spin-on coating and direct photo patterning of a dielectric and does not require high temperatures (>400° C.) nor the use of plasma etching to achieve pattern definition.

Additionally, a need exists for a low temperature method of treating deposited films to remove residual organic species of the deposited PMOD™ films.

To address those needs, processes for low temperature treatment of PMOD™ films have been developed as methods of forming high dielectric metal and metal oxide films for use in semiconductor applications that are temperature sensitive.

The processes of the present invention can provide a directly patterned metal or metal oxide film with a high dielectric constant through low temperature processing (<300° C.), thus replacing both the oxide and photoresist layers used in conventional surface imaging and ion implantation methods and allowing for the use of polymer based electronic packaging substrates. Another advantage of this invention is that the material which is produced has better etch resistance to plasma etching chemistries. A further advantage of this invention is that it facilitates the use of new materials for patterned layers, such as platinum, iridium, iridium oxide, ruthenium and ruthenium oxide, that are known in the art to be difficult or impossible to etch by conventional processes.

SUMMARY OF THE INVENTION

One embodiment of the present invention is a method of forming PMOD™ films with a high dielectric constant comprising the steps of:

selecting at least one high k precursor material, such as barium titanate or barium strontium titanate (BST);

forming a layer comprising the precursor atop a substrate;

converting at least a portion of the precursor layer;

developing the precursor layer thereby forming a pattern in the precursor layer;

transferring the pattern to the substrate, whereby a photoresist is not used in forming the pattern;

hydrothermally treating the PMOD™ film to increase the dielectric constant of the film; and thermal annealing at ~400° C.

The unconverted portion of the precursor layer can be developed away an with an appropriate developer. Alternatively, the converted portion of the precursor layer can be developed away an with a developer. The developer can be a liquid developer comprising at least one alcohol and at least one ketone, wherein the total volume of all of the alcohols present is greater than 50% of the sum of the volumes of all of the alcohols present plus the volumes of all of the ketones present in the liquid developer. Preferably, at least one alcohol of the developer is isopropyl alcohol (IPA), the at least one ketone is methyl isobutyl ketone (MIBK), and the ratio of IPA:MIBK is from about 1:1 by volume to about 1:40 by volume. A second preferred developer compound is IPA:Hexane, and the ratio of IPA:Hexane is from about 1:1 by volume to about 1:40 by volume.

Another embodiment of the present invention is a method of forming PMOD™ films with a high dielectric constant comprising the steps of:

selecting at least one high k precursor material;

forming a layer comprising the unconverted precursor on the substrate;

blanket converting unconverted precursor layer;

hydrothermally treating the PMOD™ film to increase the dielectric constant of the film; and themal annealing at 400° C.

Herein, the hydrothermal treatment step will alternately be referred to as the "photoconversion" process, which in the present invention represents the degree of transformation of the photoactive metal-organic precursor films to dense amorphous or chrystalline metal oxide films, free of organic species and free of nanoscale voids.

Conversion can be accomplished with an energy source selected from light, electron beam irradiation, ion beam irradiation, and mixtures thereof Ions can be implanted by exposing the uncovered substrate to an ion beam.

In each embodiment of the invention, a preferred precursor material is a metal complex comprising at least one ligand selected from the group consisting of acac, carboxylato, alkoxy, azide, carbonyl, nitrato, amine, halide, nitro, and mixtures thereof and at least one metal selected from the group consisting of Li, Al, Si, Ti, V, Cr, Mn, Fe, Ni, Co, Cu, Zn, Sr, Y, Zr, Nb, Mo, Ru, Rh, Pd, Ag, In, Sn, Ba, La, Pr, Sm, Eu, Hf, Ta, W, Re, Os, Ir, Pt, Au, Pb, Th, U, Sb, As, Ce, Mg, and mixtures thereof. The selected precursor solution is mixed in a solvent and deposited on a substrate, which is subsequently converted, for example by UV radiation for photolysis.

Most preferably the metal complex is selected such that a high k PMOD T film results. Examples of such resulting PMOD™ films are barium titanate (BT), lead zirconate titanate (PZT), titanium oxide, and barium strontium titanate (BST).

The hydrothermal treatment of the resulting PMOD™ films increases the density by reducing the porosity of the film and can crystallize the film under selected conditions. Hydrothermal treatment also allows for the formation of low stress films substantially free from residual organic species. These results are achieved at low process temperatures (<400° C.).

DETAILED DESCRIPTION OF THE INVENTION

Figures 1A, 1B, 1C, 1D:
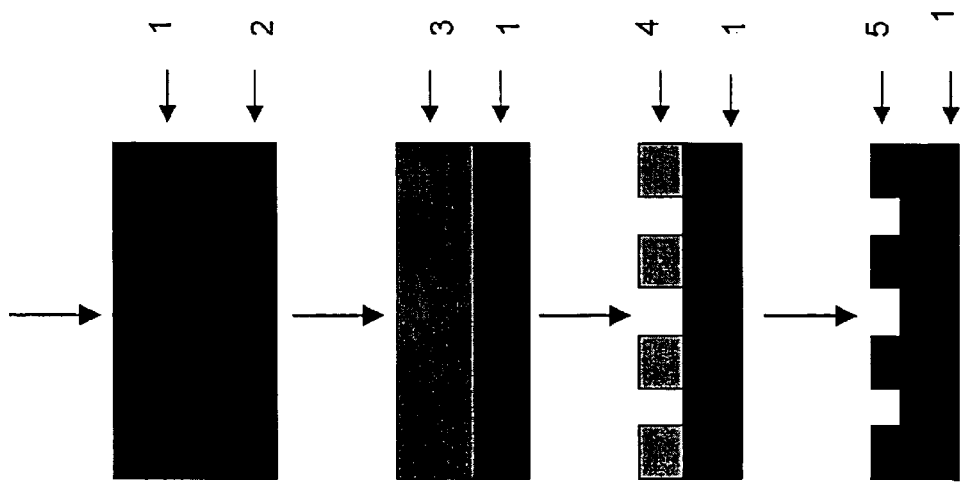
FIG. 1A illustrates the step where the PMOD™ high k precursor film is deposited on the substrate.
FIG. 1B illustrates the preimaging treatment step of the PMOD™ high k precursor film.
FIG. 1C shows the imaged, developed and patterned PMOD™ high k precursor film.
FIG. 1D shows the PMOD™ high k precursor film after it has undergone postimaging hydrothermal treatment.

The present process allows for the use of PMOD™ films where a high dielectric constant (k), high crystallinity, and/or high density film qualities are preferable but where it is not preferred to use high temperature treatment of such films. This process additionally allows for advantages available with the use of PMOD™ film deposition and formation methods. The key advantages of the PMOD™ process include: (a) selective chemical changes at a molecular level as compared to the non-selective or global changes by the thermal process, (b) compositional control and doping in multicomponent systems to achieve many desirable attributes, (c) removal of residual organic species at low temperatures, (d) formation of multilayer films having different compositions, (e) elimination of plasma etching which demands a larger number of steps and expensive tools for both the phortoresist patterning and plasma etching and (f) flexibility in obtaining amorphous high-k metal oxides, which have some unique functional behavior as compared to the crystalline phases of same compositions.

This invention provides a process for making directly patternable films of desired materials at low temperatures (e.g., <300° C.). It is important to recognize that some applications demand the deposition of patterned films at low temperatures, such as those applications using polymer based electronic packaging substrates (e.g., flexible displays, flexible circuit board, polymer thin film modules). In addition, in the field of semiconductor products, it is preferred that the process employed is not costly or complicated. Further still, some applications require particular electric film qualities, such as a high dielectric constant film (e.g., BST, BT, $TiO_2$), conductive oxides (e.g., $RuO_2$, $IrO_2$, $SrRuO_3$) or ferroelectric behavior. The present invention provides a process through which these preferences can be achieved.

One advantage of an embodiment of the present process is that it yields a patterned electronic material for such applications without using a conventional patterning material, i.e., a photoresist, in forming the pattern. Another advantage of the present process is that it permits the use of PMOD™ films, such as those in U.S. Pat. No. 5,534,312, which may be formed and may optionally be directly patterned on a substrate in applications where low processing temperatures are required and without the use of intermediate patterning materials, which may increase the processing time, decrease product throughput, and result in additional cost and lower output.

FIGS. 1A–1D provide an overview of the present process by a process flow diagram showing exemplary steps that may be followed to obtain a film of the desired material with optimized properties for a particular application. The present invention is also not limited to these steps and may include other steps, based on the ultimate application of the film. One skilled in the art will know which steps should be included or excluded to achieve the desired result for the particular application.

FIGS. 1A–1D graphically shows the steps and reactions of the photopatterning process. FIG. 1A shows the step where the PMOD™ high k precursor film 1 is deposited on substrate 2. FIG. 1B shows the preimaging treatment step of the PMOD™ high k precursor film, where the PMOD™ high k precursor film 1 of FIG. 1A is altered by a preimaging treatment step, such as a thermal treatment, to altered PMOD™ high k precursor film 3. FIG. 1C shows the imaged, developed and patterned PMOD™ high k precursor film 4. Finally, FIG. 1D shows the PMOD™ high k precursor film 5 after it has undergone postimaging hydrothermal treatment.

At each step, variables exist that may be manipulated to affect the resulting film. For example, at the step of FIG. 1A, the variables may include the composition of the precursor material, the solvent used in the precursor material, whether a solvent is used in the precursor material, the additives that may be used with the precursor material, cleaning the substrate, the deposition of a barrier layer, the deposition of an adhesion promoter, the use of a reactive layer, the use of rate enhancers that may be included with the precursor material, the method of applying the precursor film, the film thickness, the atmosphere in which the precursor is applied, and/or the temperature of the deposition.

At the step of FIG. 1B, the variables may include thermal treatment, treatment with an ion beam, treatment using microwaves, and/or the use of a particular atmosphere to alter properties the deposited film.

At the step of FIG. 1C, the variables may include whether the film is blanket exposed or patterned or a blend of each, the developer, patterning using wet or dry techniques and/or the use of a particular atmosphere.

In the present invention, the film of FIG. 1D is hydrothermally treated in FIG. 1D to increase the dielectric constant of the film, densify, and/or crystallize the film for applications where this may be a desirable process step. Hydrothermal treatment is a heat treatment process which utilizes pressure, temperature, humidity and process time to effect the properties of a converted film. The hydrothermal treatment process is effective at much lower temperatures than conventional thermal annealing processes and provides a unique opportunity to obtain preferable film qualities typically associated with thermal annealing, such as a high dielectric constant, low porosity, high density, low loss tangent, and a high refractive index. At the same time, the hydrothermal treatment process operates at a low enough temperature such that polymer based substrates may be used in applications where is was formerly not possible to use polymers because the polymers were subject to being detrimentally effected by high temperature processing steps, such as annealing. In the present invention, the hydrothermal process is applied after the PMOD™ film is converted photolytically and can be effectively applied over a wide range of temperatures, pressures, humidity levels, and process times. The preferred pressure range is between about 150 to about 300 psi. The preferred temperature range is between about 150 to about 300° C. The preferred humidity range is between 4 to about 10 grams water/liter of air. The preferred process time is between 30 minutes to about 10 hours. Table 1, below, shows the favorable refractive index results over the broad range of process variables outlined above.

TABLE 1

Refractive Index Values for Converted $TiO_2$ Films

| Sample | Temperature (° C.) | Pressure (psi) | Humidity (gms water/l) | Refractive Index |
|---|---|---|---|---|
| A | 150 | 150 | 10 | 1.935 |
| B | 300 | 300 | 4 | 2.229 |
| C | 150 | 300 | 4 | 2.0186 |
| D | 300 | 150 | 10 | 2.202 |
| E | 150 | 300 | 10 | 1.9652 |
| F | 300 | 300 | 10 | 2.2522 |
| G | 300 | 150 | 4 | 2.3289 |
| H | 150 | 150 | 4 | 1.9897 |

The most critical variable is the temperature, which must not reach high temperatures, >400° C., to utilize polymer based substrates. At temperatures higher than 400° C., polymer based substrates are subject to damage, which is not permitted in the semiconductor industry, which is continuously demanding peak performance. To obtain similar refractive index values, conventional post conversion thermal annealing requires a temperature of about 550° C., which would damage a polymer based substrate.

The samples were processed in a nitrogen gas atmosphere, however, any inert gas atmosphere or mixture of such gases would also be suitable. An oxygen gas containing atmosphere or may be preferred in some applications to drive the oxidation reaction. Most material in the precursor film converts to $TiO_2$ but some titanium may form titanium hydroxides by the following reaction:

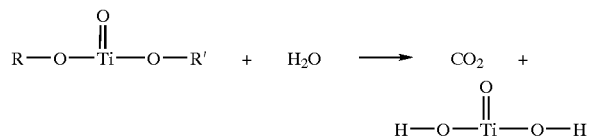

wherein R and R' are organic compounds.

Although the hydrothermal treatment process uses water, hydrogen peroxide may be used to drive an oxidation reaction, and ammonia may be used where a reducing atmosphere is preferred.

Following the hydrothermal reaction, the photoconverted films may be thermally annealed using a hot plate, an annealing chamber, or a tube furnace. The following are examples of conditions for the thermal anneal step:

(a) using a hot plate in air at 300° C.;
(b) using an annealing chamber under vacuum at 350–400° C.; or
(c) using a tube furnace in a dynamic oxygen environment at 350–400° C.

A post bake at from about 350° C. to about 400° C. after the hydrothermal treatment will convert the $TiO(OH)_2$ compounds to $TiO_2$, releasing $H_2O$ and reducing the conductivity of the formed film. The reaction is as follows:

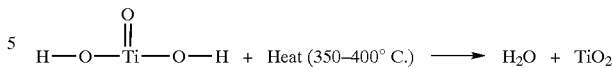

These variables are intended as examples and are not to be considered exhaustive lists of the variables that may be manipulated to affect the properties of the resulting film. More specific aspects and embodiments of the present invention are described in detail below.

Where a patterned film is desired, the process described here may proceed photochemically, without the use of an intermediate patterning material, e.g., a photoresist, and may be undertaken under ambient conditions, or may be undertaken under other conditions such as either an air or other composition atmosphere and/or under a variety of pressures, e.g., ambient, higher or lower than ambient, and may be used in conjunction with a variety of other processing steps to yield unique materials, layers and structures.

Where the process is performed photolytically, the process proceeds at substantially ambient temperatures, which allows for a broad choice of materials to be used in the assembly of devices associated with the applications of the method.

The process of the present invention generally proceeds satisfactorily under substantially ambient pressure. In contrast, many of the prior art deposition methods, in addition to having the aforementioned limitations, must be undertaken under conditions of high vacuum, invoking the necessity for expensive and complicated equipment that is difficult to run and maintain.

The processes of the present invention facilitates the formation of a thin layer on a substrate from a precursor material. The precursor comprises molecules specifically designed for their ability to coat the substrate in a uniform manner, resulting in films of high optical quality, and, in the case of the present process, for photosensitivity. The identity of the precursor molecule is a significant variable—a wide variety of metal complexes of the formula $M_aL_b$ comprising at least one metal ("M"), i.e., a is an integer which is at least 1, and at least one suitable ligand ("L") or ligands, i.e., b is an integer which is at least 1, are envisioned by this invention. Metal complexes $M_aL_b$ are often of the more general structure $M_aL_bL'_c$, for example $Ti(acac)_2(O-iPr)_2$. Compounds of the formula $M_aM'_bL_cL'_d$ are used to facilitate the formation of mixed films such as $BaTiO_3$ films with perovskite nanocrystallites. Suitable precursors are described in copending U.S. patent application Ser. No. 09/875,115, entitled Method of Making Electronic Materials, filed Jun. 6, 2001, which is incorporated herein by reference in its entirety. In addition, there are several mechanisms by which a suitable photochemical reaction may occur. These mechanisms are described in U.S. Pat. No. 5,534,312. In its broad aspects, however, this invention is not to be construed to be limited to these reaction mechanisms.

The precursor may be applied to the substrate directly. Alternatively and preferably, the precursor is dissolved in a solvent or solvents to form a precursor solution. This facilitates its application to the substrate by a variety of means well known to those of ordinary skill in the art, such as by spin or spray application of the solution to the substrate. The solvent may be chosen based on several criteria, individually or in combination, including the ability of the solvent to dissolve the precursor, the inertness of the solvent relative to the precursor, the viscosity of the solvent, the solubility of oxygen or other ambient or other gases in the solvent, the UV, visible, and/or infra-red absorption spectra of the solvent, the absorption cross-section of the solvent with respect to electron and/or ion beams, the volatility of the solvent, the ability of the solvent to diffuse through a subsequently formed film, the purity of the solvent with respect to the presence of different solvent isomers, the purity of the solvent with respect to the presence of metal ions, the thermal stability of the solvent, the ability of the solvent to influence defect or nucleation sites in a subsequently formed film, and environmental considerations concerning the solvent. Exemplary solvents include the alkanes, such as hexanes, the ketones, such as methyl isobutyl ketone ("MIBK") and methyl ethyl ketone ("MEK"), and propylene glycol monomethyl ether acetate ("PGMEA").

Chemical additives are optionally present with the precursor or in the precursor solution. These may be present for any or several of the following reasons: to control the photosensitivity of a subsequently deposited precursor or film, to aid in the ability to deposit uniform, defect-free films onto a substrate, to modify the viscosity of the solution, to enhance the rate of film formation, to aid in preventing film cracking during subsequent exposure of the deposited film, to modify other bulk properties of the solution, and to modify in important ways the properties of the film of the desired material. The additives are chosen on these criteria in addition to those criteria employed when choosing a suitable solvent. It is preferable that the precursor or the precursor solution be substantially free of particulate contamination so as to enhance its film-forming properties.

The nature of the substrate to which the precursor is applied is not critical for the process, however, the process is particularly useful where a polymer based substrate is used because such substrate materials are more sensitive to high temperatures.

The method of application of the precursor or the precursor solution may be chosen depending on the substrate and the intended application. Some examples of useful coating methods well known to those of ordinary skill in the art include spin, spray, dip and roller coating, stamping, meniscus, and various inking approaches, e.g., inkjet-type approaches. Variables in the coating process may be chosen in order to control the thickness and uniformity of the deposited film, to minimize edge effects and the formation of voids or pinholes in the film, and to ensure that no more than the required volume of precursor or precursor solution is consumed during the coating process. Optimized application of the precursor film may desirably yield very smooth films.

The deposited film may, optionally, be subjected to a baking or vacuum step where any residual solvent present in the deposited film may be driven off. If a baking step is employed, it is, of course, important to keep the temperature of this step below the temperature at which the precursor molecules decompose thermolytically and below a temperature that may negatively effect the substrate, i.e. 400° C. The process of the invention allows for blanket thermal or heat treatment or annealing of the precursor cast film so as to convert it thermolytically into a blanket uniform coating of the desired material, or to a film that requires a lower partial converting means and/or converting means dose for patterning than would have been possible without the thermal treatment. The deposited film may optionally be subjected to other treatments at this stage of the process, including but not limited to blanket photochemical or electron beam exposure and microwave treatment.

It is recognized that a bake step at this stage of the process may contribute to ejecting solvent from the precursor film and also initiate a thermal decomposition process. Both of these mechanisms may aid in the overall efficiency of the process resulting in, for example, a lower dose requirement during a subsequent partial converting and/or converting step. It is further recognized that during such a bake step, a new material, different from either the deposited film or the film of the desired material, may be formed.

The deposited film is next subjected to a partial converting means and/or converting means, i.e., a source of energy, such that the precursor is at least partially converted and the conversion does not detrimentally effect the substrate. The entire film, or selected regions of the deposited precursor film, may be exposed to a source of energy. The energy source may be, e.g., a light source of a specific wavelength, a coherent light source of a specific wavelength or wavelengths, a broadband light source, an electron beam ("e-beam") source, or an ion beam source. Light in the wavelength range of from about 150 to about 600 nm is suitably used. Preferably, the wavelength of the light is from about 157 to about 436 nm.

Following at least partial conversion of the deposited precursor, the precursor film may, optionally, be treated by any of a variety of methods well known to the art prior to removing at least a portion of the unconverted precursor layer. Unexposed regions of the deposited film, or a portion thereof, may then be removed by the application of a removing (or developing) means.

After development, the at least partially converted precursor may, optionally, be treated by any of a variety of methods well known to the art prior to its being subjected to a converting means. If the precursor has yet to be substantially fully converted, the precursor film is next optionally but typically subjected to a converting means such that the precursor is substantially fully converted. The entire film or selected regions of the precursor film may be exposed to a source of energy. The converting means can be an energy source that may be the same as or different from any partial converting means previously employed. For example, the converting means may be a light source of a specific wavelength, a coherent light source of a specific wavelength, a broadband light source, an electron beam source, and/or an ion beam source.

After conversion, the high k metal-oxide patterned films such as barium titanate or barium strontium titanate (BST) that are produced by this process technology are amorphous in nature and have densities significantly lower than the theoretical density due to nanoporosity. As a result, the dielectric constants of the films are significantly lower than the dense crystallized films and have no significant ferroelectric behavior. Consequently, the performance of such a film in applications which require crystalline phases, such as a decoupling capacitor, is not feasible.

Table 2, below, shows the refractive index results for three separate precursors that have experienced varying the conversion process. The data shows the refractive indices with no UV treatments up to 8 UV treatments and additionally shows the refractive indices of samples that have been treated by both UV treatment and a post conversion thermal treatment and solely treated with a thermal conversion. As shown, the only refractive index of the $TiO_2$ film that is above 2.0 is where the sample was converted using a UV source, followed by a post UV thermal treatment. Table 2 does not contain results from any sample that has undergone hydrothermal treatment.

TABLE 2

Effect of Exposure Dose on Photoconversion of TiO₂ Percursors A–C

| UVEX passes | Precursor A RI | Precursor B RI | Precursor C RI |
|---|---|---|---|
| 0 | 1.537 | 1.529 | 1.587 |
| 2 | 1.893 | 1.899 | 1.938 |
| 4 | 1.927 | 1.875 | 1.938 |
| 6 | 1.937 | 1.914 | 1.942 |
| 8 | 1.939 | 1.923 | 1.958 |
| UV w/post UV thermal treatment | 2.129 | 2.086 | 2.121 |
| Thermal conversion only | 1.936 | 1.837 | 1.943 |

The values of the dielectric constant of BST Titanate developed by PMOD™ process at present is in the range 20 to 30. The refractive index of present BST films after hydrothermal treatment is in the range 1.65 to 1.80, whereas the reference refractive index fully dense BST film is about 2.5. The values of the dielectric constant of BST films developed by the PMOD™ process described above is in the range 20 to 30. The dielectric constant of crystallized/dense BST films after hydrothermal treatment are in the range 200 to 500. The reference dielectric constants of Pervskite Dielectrics are:

| (Ba, Sr) TiO₃ | k = 250–500 |
|---|---|
| Pb(Zr, Ti)O₃ | k = 400–1500 |

The conventional methods of densification and crystallization of metal oxide films require a high temperature thermal treatment above 500° C. This high temperature thermal treatment limits the applications of the PMOD™ films to a great extent because the high temperature is damaging to polymers, thus, it has generally not been feasible to use polymer based substrates where an annealing step is required. However, the novel process of the present invention allows the use of previously unusable polymer based substrates by using a low temperature hydrothermal treatment process that can be used to densify and chrystallize the film. Table 3 below shows that to achieve equivalent results, a conventional thermal treatment must be done at a temperature in excess of 550° C., which would damage polymer based substrates.

TABLE 3

Refractive Index (RI), Density and Porosity of Converted TiO₂ Films

| Sample | Substrate | Processing | Thickness (A) | RI | Density | Porosity |
|---|---|---|---|---|---|---|
| 1 | Si/Pt | UV | 688 | 1.96 | 2.5 | 24.2 |
| 2 | Si | UV/300° C., 3 h | 576 | 2.10 | 2.94 | 10.9 |
| 3 | Si/Pt | UV/550° C., 30 m, vac. | 532 | 2.23 | 3.39 | 11.7 |
| 4 | Si/Pt | UV/HT | 591 | 2.21 | | 7.57 |
| 5 | Si/Pt | 300° C., 3 h | 387 | | | 8.71 |
| 6 | Si/Pt | UV, 300° C., 3 h, 600° C., 30 m | 492 | 2.16 | | 6.02 |

Table 3 shows data for six samples that were treated in different post-conversion manners. The goals for the present invention is to achieve a low porosity and a refractive index near that of the reference value of about 2.5. As can be shown above, samples 3 and 4 have refractive index values nearest to the reference value, however, sample 3, which is a conventional heat treatment, used a temperature of 550° C., which is far in excess of 400° C., at which polymer based substrates would be damaged.

An additional benefit of the hydrothermal treatment process is that a greater rate of organic residues removal is achieved. The amount of organic residue removal is critical to the consistency of the resulting film properties. Remaining organic residues may render the electric properties of the film unpredictable, for example, organic residues may increase the conductivity of a dielectric film. As shown in Table 4, the sample using hydrothermal treatment has substantially less trace carbon per atom % than the use of a conventional thermal treatment and even less trace carbon than the two samples that did not use a post conversion step. Optionally, a suitable residue cleaner may be used to further clean any remaining residue.

TABLE 4

Trace Carbon Analysis of Converted TiO₂ Films, HT = hydrothermal treatment.

| Sample | Processing History | Thickness (A) | % Trace Carbon |
|---|---|---|---|
| 7 | UV | 634 | 6.2 |
| 8 | UV | 307 | 5.3 |
| 9 | 180° C., 1 hr/ 300° C., 1 h | 318 | 16.5 |
| 10 | UV/HT | 240 | 2.9 |

Moreover, as shown in Table 5, the hydrothermally treated films also exhibited higher dielectric constants than the thermally treated films post conversion. As seen in Table 5, the formed nanocrystalline TiO₂ during the hydrothermal process will allow for a higher k value compared to the k value for a thermally formed film, even when the thermally formed film is treated at 550° C.

TABLE 5

Electrical Data for PMOD ™ TiO₂ Films

| Sample | Processing History | Dielectric Constant (k) |
|---|---|---|
| 11 | UV/HT(300° C.) | 33.84 |
| 12 | UV/HT(300° C.) | 28.4 |
| 13 | UV/HT(300° C.) | 29.53 |
| 14 | UV/550° C., 30 m (6 c/m, vac) | 25 |

As shown in Table 5, the use of a hydrothermal treatment step produces better results than the sample that was treated with a conventional thermal treatment. Yet another advantage of the present hydrothermal treatment process is the reduction of stresses across the PMOD™ film, resulting in less cracking and an overall higher quality film than that resulting from conventional thermal treatment.

All of the methods disclosed and claimed herein can be made and executed without undue experimentation in light of the present disclosure. While the methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. More specifically, it will be apparent that certain agents which are both chemically and physiologically related may be substituted for the agents described herein while the same or similar results would be achieved.

All such similar substitutes and modifications apparent to those skilled in the art are deemed to be within the spirit, scope and concept of the invention as defined by the appended claims.

What is claimed is:

1. A method of forming a film on a substrate comprising the steps of:
   selecting at least one precursor material;
   applying said precursor material to a substrate to form a precursor layer;
   converting at least a portion of the precursor layer;
   developing the precursor layer to form a film; and
   hydrothermally treating said film.

2. The method of claim 1, wherein said precursor is converted photolytically.

3. The method of claim 1, wherein said substrate includes a polymer.

4. The method of claim 3, wherein said film is hydrothermally treated at a temperature from about 150° C. to about 300° C.

5. The method of claim 4, wherein said film is hydrothermally treated at a pressure from about 150 psi to about 300 psi.

6. The method of claim 5, wherein said film is hydrothermally treated at a humidity from about 4 grams of water/l to about 10 grams of water/l.

7. The method of claim 4, further comprising baking said hydrothermally treated film.

8. The method of claim 7, wherein said baking is at a temperature from about 300° C. to about 400° C.

9. The method of claim 8, wherein said baking is conducted using an apparatus selected from the group comprised of a hot plate, an annealing chamber, and a tube furnace.

10. The method of claim 4, wherein said hydrothermal treatment is conducted in an atmosphere selected from an inert gas, oxygen, and a mixture thereof.

11. The method of claim 4, wherein said hydrothermal treatment is conducted using hydrogen peroxide.

12. The method of claim 4, wherein the hydrothermally treated film is crystalline.

13. The method of claim 12, wherein said film includes one or more materials selected from the group consisting of barium strontium titanate, lead zirconate titanate, and titanium oxide.

14. The method of claim 1, further comprising selecting the at least one precursor material from a metal complex comprising at least one ligand selected from the group consisting of acac, carboxylato, alkoxy, azide, carbonyl, nitrato, amine, halide, nitro, and mixtures thereof and at least one metal selected from the group consisting of Li, Al, Si, Ti, V, Cr, Mn, Fe, Ni, Co, Cu, Zn, Sr, Y, Zr, Nb, Mo, Ru, Rh, Pd, Ag, In, Sn, Ba, La, Pr, Sm, Eu, Hf, Ta, W, Re, Os, Ir, Pt, Au, Pb, Th, U, Sb, As, Ce, Mg, and mixtures thereof.

15. A method of forming a film on a substrate containing a polymer, comprising the steps of:
   selecting at least one precursor material;
   applying said precursor material to a substrate to form a precursor layer;
   converting at least a portion of the precursor layer photolytically;
   developing the precursor layer to form a film;
   hydrothermally treating said film at a temperature from about 150° C. to about 300° C.;
   and then baking said film is at a temperature from about 300° C. to about 400° C.

16. The method of claim 15, wherein said film is hydrothermally treated at a pressure from about 150 psi to about 300 psi.

17. The method of claim 16, wherein said film is hydrothermally treated at a humidity from about 4 grams of water/l to about 10 grams of water/l.

18. The method of claim 17, further comprising irradiating said film with an energy source selected from light, electron beam, ion beam, and mixtures thereof.

19. The method of claim 15, wherein the hydrothermally treated film is crystalline.

20. The method of claim 19, wherein the film includes one or more high-dielectric constant materials.

21. The method of claim 15, further comprising removing organic residue with a suitable residue remover containing hydroxylamine.

* * * * *